(12) United States Patent
Poblenz et al.

(10) Patent No.: US 7,976,630 B2
(45) Date of Patent: Jul. 12, 2011

(54) LARGE-AREA SEED FOR AMMONOTHERMAL GROWTH OF BULK GALLIUM NITRIDE AND METHOD OF MANUFACTURE

(75) Inventors: Christiane Poblenz, Goleta, CA (US); James S. Speck, Goleta, CA (US); Derrick S. Kamber, Goleta, CA (US)

(73) Assignee: Soraa, Inc., Goleta, CA (US)

( * ) Notice: Subject to any disclaimer, the term of this patent is extended or adjusted under 35 U.S.C. 154(b) by 0 days.

(21) Appl. No.: 12/556,558

(22) Filed: Sep. 9, 2009

(65) Prior Publication Data

US 2010/0075175 A1    Mar. 25, 2010

Related U.S. Application Data (60) Provisional application No. 61/096,304, filed on Sep. 11, 2008, provisional application No. 61/178,460, filed on May 14, 2009.

(51) Int. Cl.
*C30B 21/02*    (2006.01)

(52) U.S. Cl. ............... 117/86; 117/104; 117/105

(58) Field of Classification Search ............ 117/86, 117/104, 105, 100, 99
See application file for complete search history.

(56) References Cited

U.S. PATENT DOCUMENTS

| | | | |
|---|---|---|---|
| 7,078,731 | B2 | 7/2006 | D'Evelyn et al. |
| 7,198,671 | B2 | 4/2007 | Ueda |
| 7,211,833 | B2 | 5/2007 | Slater, Jr. et al. |
| 2007/0218703 | A1 | 9/2007 | Kaeding et al. |

OTHER PUBLICATIONS

Amano et al., "Metalorganic Vapor Phase Epitaxial Growth of a High Quality GaN Film Using an AlN Buffer Layer," 1986, Applied Physics Letter, vol. 48, No. 353, pp. 353-355.
Baker et al., "Characterization of Planar Semipolar Gallium Nitride Films on Spinel Substrates," 2006, Japanese Journal of Applied Physics, No. 29, pp. L154-L157.
Baker et al., "Characterization of Planar Semipolar Gallium Nitride Films on Spinel Substrates," 2005, Japanese Journal of Applied Physics, vol. 44, No. 29, pp. L920-L922.
Cantu et al., "Si Doping Effect on Strain Reduction in Compressively Strained Al0.49Ga0.51N Thin Films" 2003, Applied Physics Letter, vol. 83, No. 4, pp. 674-676.
Chakraborty et al., "Defect Reduction in a Nonpolar a-Plane GaN Films Using in situ SiNx Nanomask", 2006, Applied Physics Letters, vol. 89, pp. 041903-1-041903-3.
Corrion et al., "Structural and Morphological Properties of GaN Buffer Layers Grown by Ammonia Molecular Beam Epitaxy on SiC Substrates for AlGaN/GaN High Electron Mobility Transistors," 2008, Journal of Applied Physics, vol. 103, pp. 093529-1-093529-7.
Davidsson et al., "Effect of AlN Nucleation Layer on the Structural Properties of Bulk GaN Grown on Sapphire by Molecular-beam Epitaxy," 2005, Journal of Applied Physics, vol. 98, pp. 016109-1-016109-3.
D'Evelyn et al., "Bulk GaN Crystal Growth by the High-Pressure Ammonothermal Method," 2007, Journal of Crystal Growth, vol. 300, pp. 11-16.

(Continued)

*Primary Examiner* — Robert M Kunemund
(74) *Attorney, Agent, or Firm* — Kilpatrick Townsend & Stockton LLP (57) ABSTRACT

A high-quality, large-area seed crystal for ammonothermal GaN growth and method for fabricating. The seed crystal comprises double-side GaN growth on a large-area substrate. The seed crystal is of relatively low defect density and has flat surfaces free of bowing. The seed crystal is useful for producing large-volume, high-quality bulk GaN crystals by ammonothermal growth methods for eventual wafering into large-area GaN substrates for device fabrication.

20 Claims, 7 Drawing Sheets

OTHER PUBLICATIONS

Grandjean et al., "Nitridation of Sapphire. Effect on the Optical Properties of GaN Epitaxial Overlayers," 1996, Applied Physics Letters, vol. 69, No. 18, pp. 2071-2073.

Green et al., "Polarity Control During Molecular Beam Epitaxy Growth of Mg-doped GaN," 2003, Journal of Vacuum Science Technology, vol. B-21, No. 4, pp. 1804-1811.

Hellman et al., "The Polarity of GaN: a Critical Review," 1998, MRS Internet Journal Nitride Semiconductor Research, vol. 3, No. 11, pp. 1-11.

Heying et al., "Control of GaN Surface Morphologies Using Plasma-Assisted Molecular Beam Epitaxy," 2000, Journal of Applied Physics, vol. 88, No. 4, pp. 1855-1860.

Katona et al., "Observation of Crystallographic Wing Tilt in Cantilever Epitaxy of GaN on Silicon Carbide and Silicon (111) Substrates", 2001, Applied Physics Letters, vol. 79, No. 18, pp. 2907-2909.

Keller et al., "Influence of the Substrate Misorientation on the Properties of N-polar GaN Films Grown by Metal Organic Chemical Vapor Deposition," 2007, Journal of Applied Physics, vol. 102, pp. 083546-1-083546-6.

Keller et al., "Influence of Sapphire Nitridation on Properties of Gallum Nitride Grown by Metalorganic Chemical Vapor Deposition," 1996, Applied Physics Letters, vol. 68, No. 11, pp. 1525-1527.

Koblmuller et al., High Electron Mobility GaN Grown Under N-rich Conditions by Plasma-assisted Molecular Beam Epitaxy, 2007, Applied Physics Letters, vol. 91, pp. 221905-1-221905-3.

Koblmuller et al., "In Situ Investigation of Growth Modes During Plasma-assisted Molecular Beam Epitaxy of (0001) GaN," 2007, Applied Physics Letters, vol. 91, pp. 161904-1-161904-3.

Manfra et al., "Dislocation and Morphology Control During Molecular-Beam Epitaxy of AlGaN/GaN Heterostructures Directly on Sapphire Substrates," 2002, Applied Physics Letters, vol. 81, pp. 1456-1458.

Marchand et al., "Microscructure of GaN Laterally Overgrown by Metalorganic Chemical Vapor Deposition", 1998, Applied Physics Letters, vol. 73, No. 6, pp. 747-749.

Nakamura, et al., "GaN Growth Using GaN Buffer Layer," 1991, Japanese Journal of Applied Physics, vol. 30, No. 10A, pp. L 1705-L 1707.

Park et al., "Selective-area and Lateral Epitaxial Overgrowth of III-N Materials by Metal Organic Chemical Vapor Deposition," 1998, Applied Physics Letters, vol. 73, No. 3, pp. 333-335.

Romanov et al., "Stress Relaxation in Mismatched Layers Due to Threading Dislocation Inclination" 2003, Applied Physics Letter, vol. 83, No. 13, pp. 2569-2571.

Stutzmann et al., "Playing with Polarity," 2001, Physics Status Solidi, vol. B-228, No. 2, pp. 505-512.

Sumiya et al., "Review of Polarity Determination and Control of GaN," 2004, MRS Internet Journal Nitride Semiconductor Research, vol. 9, No. 1, pp. 1-34.

Sumiya et al., "Growth Mode and Surface Morphology of a GaN Film Deposited Along the N-face Polar Direction on c-plane Sapphire Substrate," 2000, Journal of Applied Physics, vol. 88, No. 2, pp. 1158-1165.

Waltereit et al., "Structural Properties of GaN Buffer Layers on 4H-SiC (OOO1) Grown by Plasma-Assisted Molecular Beam Epitaxy for High Electron Mobilty Transistors," 2004, Japanese Journal of Applied Physics, vol. 43, No. 12-A, pp. L1520-L1523.

Weyher et al., "Morphological and Structural Characteristics of Homoepitaxial GaN Grown by Metalorganic Chemical Vapour Deposition (MOCVD)," 1999, Journal of Crystal Growth, vol. 204, pp. 419-428.

Xu et al., "Polarity Control of GaN Grown on Sapphire Substrate by RF-MBE," 2002, Journal of Crystal Growth, vol. 237-239, Part 2, pp. 1003-1007.

International Search Report & Written Opinion of PCT Application No. PCT/US2009/056546, date of mailing Nov. 2, 2009, 13 pages total.

LARGE-AREA SEED FOR AMMONOTHERMAL GROWTH OF BULK GALLIUM NITRIDE AND METHOD OF MANUFACTURE

CROSS-REFERENCES TO RELATED APPLICATIONS

This application claims priority to U.S. Provisional Application No. 61/096,304 filed Sep. 11, 2008 and U.S. Provisional Application No. 61/178,460 filed May 14, 2009, commonly assigned, both of which are incorporate by reference in their entirety herein. This application is related to U.S. patent application Ser. No. 12/556,562, filed Sep. 9, 2009, commonly assign, and of which is incorporate by reference in its entirety herein.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to crystalline materials. More particularly, the present invention provides a seed crystal and method using back and front side deposition of crystalline materials, e.g., GaN, AlN, InN. In a specific embodiment, the seed crystals can be used in an ammonothermal growth process or the like. Merely by way of example, the present substrate materials can be used in applications such as such as light emitting diodes, integrated circuits, MEMS, medical devices, combination of these, among others.

Single-crystal gallium nitride (GaN) containing compounds and related alloy compounds containing aluminum and indium (AlN, $Al_xGa_{1-x}N$, InN, $In_xGa_{1-x}N$) are useful semiconducting materials. Such semiconductor materials can be useful for a variety of applications due to their large bandgap and high chemical and thermal stability. In recent years there has been significant technological advancement in electronic and optoelectronic devices based on these materials, such as transistors, solar cells, light-emitting diodes, and lasers, among others. Although some of these products are available in the commercial market today, lack of a suitable GaN substrate on which to grow these materials remains a limitation to both performance and providing low cost, volume production of devices.

Conventional approaches to growth of GaN, AN or InN containing compounds (collectively referred to as "(Al,In)GaN" compounds) and devices employ foreign substrate materials (containing one or more primary chemical species which is different from Ga, Al, In, or N), a process known as "heteroepitaxy". Heteroepitaxial approaches to growth of (Al,In)GaN containing compounds result in epitaxial films with high defect densities due to the large lattice mismatch, chemical dissimilarity and thermal expansion coefficient difference between the nitride materials and substrate. The presence of defects is well-known to be detrimental to device performance. The thermal expansion coefficient difference between the substrate and the epitaxial layer in heteroepitaxy results in strain gradients in the material which can lead to wafer curvature, referred to as bow or warp, after growth. As used herein, the terms bow and warp are used in a manner which is well understood in this art. Definitions, for example, can be found from SEMI (www.semi.org), but can be others commonly known. There is therefore a need for bulk GaN substrates of high crystalline quality, ideally cut from large volume bulk GaN ingots.

Ammonothermal growth is a promising low cost and potentially highly scalable approach to produce such a GaN ingot. Ammonothermal growth has provided high quality crystalline material. Unfortunately, drawbacks exist. As an example, ammonothermal growth techniques lead to small sized crystals, which are often not useful for commercial applications. Additionally, defects in the seed material used for ammonothermal growth often replicate on any grown crystal structures. These and other limitations often exist with conventional ammonothermal techniques.

From the above, it is seen that techniques for improving crystal growth are highly desired.

BRIEF SUMMARY OF THE INVENTION

According to the present invention, techniques for manufacture of crystalline materials are described. More particularly, the present invention provides a seed crystal and method using back and front side deposition of crystalline materials, e.g., GaN, AN, InN. In a specific embodiment, the seed crystals can be used in an ammonothermal growth process or the like. Merely by way of example, the present substrate materials can be used in applications such as such as light emitting diodes, integrated circuits, MEMS, medical devices, combination of these, among others.

In a specific embodiment, the present invention provides a high quality gallium containing seed crystal having a large area that is substantially flat and free of bowing and/or bending. Of course, there can be other variations, modifications, and alternatives.

In a specific embodiment, the present invention provides a method for fabricating crystalline material, e.g., GaN. The method includes providing a crystalline substrate material having a first surface and a second surface. The method maintains the crystalline substrate material by engaging the second surface while exposing the first surface. In a specific embodiment, the method includes forming a first thickness of first crystalline material overlying the first surface of the crystalline substrate material. In a preferred embodiment, the first thickness of first crystalline material has a first orientation. In a specific embodiment, the method also includes providing the crystalline substrate material having the overlying first crystalline material and exposing the second surface of the crystalline substrate material. The method includes forming a second thickness of second crystalline material overlying the second surface of the crystalline substrate material such that the second thickness of second crystalline material has substantially a same thickness as the first thickness of first crystalline material. In a specific embodiment, the first thickness and second thickness comprise substantially similar composition. In this embodiment a substantially similar composition refers to the lattice constants of the primary constituent material within the first thickness and the primary constituent material within the second thickness being within about 0.01 Å. In another embodiment, the compositions of the first crystalline material and the second crystalline material are different but the lattice constant of the two materials are substantially the same being with about 0.05 Å of each other. In a preferred embodiment, the second thickness of second crystalline material has a second orientation. In a specific embodiment, both the first thickness and second thickness have epitaxial relationships with the crystalline substrate material.

One or more benefits may be achieved using one or more of the specific embodiments. As an example, the present device and method provides a substantially flat and large area seed crystal having high quality suitable for an ammonothermal or like process of crystal growth. In a specific embodiment, the present method and device can be made using conventional techniques and is cost effective. Depending upon the embodiment, one or more of these benefits can be achieved. These and other benefits are further described throughout the present specification and more particularly below.

DETAILED DESCRIPTION OF THE INVENTION

According to the present invention, techniques for manufacture of crystalline materials are provided. More particularly, the present invention provides a seed crystal and method using back and front side deposition of crystalline materials, e.g., GaN, AN, InN, $(Al_xB_yIn_zGa_{1-x-y-z})N$. In a specific embodiment, the seed crystals can be used in an ammonothermal growth process or the like. Merely by way of example, the present materials can be used in applications such as such as light emitting diodes, integrated circuits, MEMS, medical devices, combination of these, among others.

According to a specific embodiment of the present invention, techniques are provided for manufacture of a seed crystal for ammonothermal growth of GaN which is large-area and is substantially free of bowing. Such a seed is obtained through double-sided deposition on both sides of a foreign substrate such as sapphire ($Al_2O_3$), silicon carbide (SiC), silicon, $Mg_2AlO_4$ spinel, $ZrB_2$, among others. Such substrate materials are commonly available with large area (2" or greater in diameter) according to a specific embodiment. In a specific embodiment, the layers deposited on both the front and back sides of the substrate have an epitaxial relationship to the substrate material. In another embodiment the layers deposited on both the front and back sides of the substrate are substantially similar in composition. For example, the lattice constants of the primary constituent material in each layer are within about 0.01 Å. In another embodiment, the layers deposited on both the front and back sides of the substrate have substantially similar lattice constants but not necessarily similar compositions. For example, the primary constituent material on one side of the substrate is a GaN layer and the primary constituent material on the other side of the substrate is a $(Al_xB_yIn_zGa_{1-x-y-z})N$ layer with a substantially similar lattice constant, typically within 0.05 Å. The substrate is suitable for epitaxy (i.e. polished) on both sides of the wafer, for example by chemical mechanical polishing and other treatment processes. According to a specific embodiment, growth could occur by any form of molecular beam epitaxy (MBE), metal-organic chemical vapor deposition (MOCVD), hydride vapor phase epitaxy (HVPE) or other suitable techniques for thin film growth of nitride materials including but not limited to liquid phase epitaxy (LPE), laser ablation, among others, for example. These deposition techniques, in particular MOCVD and MBE, can be used for deposition of (Al,B,In)GaN containing layers. In a specific embodiment, at least one technique can be used to reduce threading dislocation densities. One such technique which is well known in GaN epitaxy is lateral epitaxial overgrowth (LEO) (See for example, J. Park, P. A. Grudowski, C. J. Eiting, and R. D. Dupuis, "Selective-area and lateral epitaxial overgrowth of III-N materials by metal organic chemical vapor deposition", Appl. Phys. Lett. 73, 333 (1998), and H. Marchand, X. H. Wu, J. P. Ibbetson, P. T. Fini, P. Kozoodoy, S. Keller, J. S. Speck, S. P. DenBaars, and U. K. Mishra, "Microscructure of GaN laterally overgrown by metalorganic chemical vapor deposition", Appl. Phys. Lett. 73, 747 (1998)). Another technique is SiN nanomasking, in which an in-situ layer of SiN is deposited which is porous on a nanometer scale, providing defect reduction uniformly across the wafer in a similar fashion to LEO but without external processing steps (See for example, A. Chakraborty, K. C. Kim, F. Wu, J. S. Speck, S. P. DenBaars, and U. K. Mishra, "Defect reduction in a nonpolar a-plane GaN films using in situ $SiN_x$ nanomask", Appl. Phys. Lett. 89, 041903 (2006)). Another technique is known as cantilever epitaxy, where a pattern is etched into the substrate material prior to deposition with appropriate dimensions such that lateral growth from the unetched plateaus is achieved (See for example, T. M. Katona, M. D. Craven, P. T. Fini, J. S. Speck, and S. P. DenBaars, "Observation of crystallographic wing tilt in cantilever epitaxy of GaN on silicon carbide and silicon (111) substrates", Applied Physics Letters 79, 2907 (2001)).

Additionally as background to the present invention, we discovered that the resulting crystalline quality using ammonothermal growth depends directly on having a high quality GaN seed crystal for growth. We also believe that the seed is preferably large-area in order to accommodate eventual wafering into large-area substrates for device fabrication.

Additionally, seed crystals of GaN for ammonothermal growth can be obtained in various ways. As low dislocation densities are desired, one approach to producing thick GaN layers or bulk GaN (via substrate removal after heteroepitaxial growth) for ammonothermal seed is by hydride vapor phase epitaxy (HVPE). However, HVPE films commonly contain dislocation densities on the order of ~$10^{10}$ cm$^{-2}$ at the onset of growth. These can drop by several orders of magnitude (to ~$10^6$-$10^7$ cm$^{-2}$) after hundreds of microns of growth, however grain and tilt boundaries may be present and surfaces can be faceted. In addition, thermal mismatch between the HVPE-grown layer and the substrate induces strain gradients in the material which result in bowing upon cooldown. Additionally, inclination of threading dislocations can result in strain gradients (See for example, A. E. Romanov and J. S. Speck, Appl. Phys. Lett. 83, 2569 (2003), and P. Cantu, F. Wu, P. Waltereit, S. Keller, A. E. Romanov, U. K. Mishra, S. P. DenBaars, and J. S. Spec, Appl. Phys. Lett. 83, 674 (2003)). Bowing persists in the HVPE-GaN seed crystal even after subsequent substrate removal (most notably from strain gradients due to threading dislocation inclination), and thus, would persist in ammonothermally grown GaN if this material is used as a seed. These and other limitations are overcome by one or more of the techniques described throughout the present specification and more particularly below.

Figure 1:
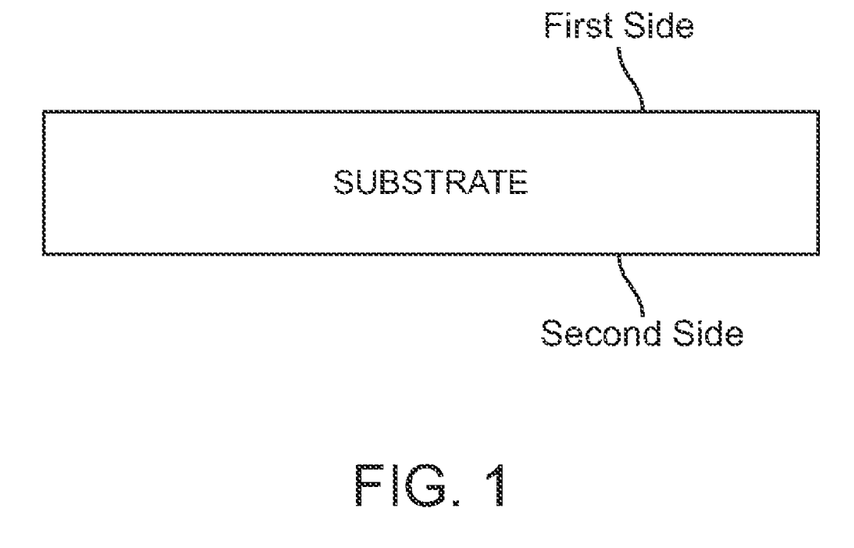
FIG. 1 is a simplified diagram of a crystalline substrate material with a first side and a second side according to an embodiment of the present invention.
Figure 2:
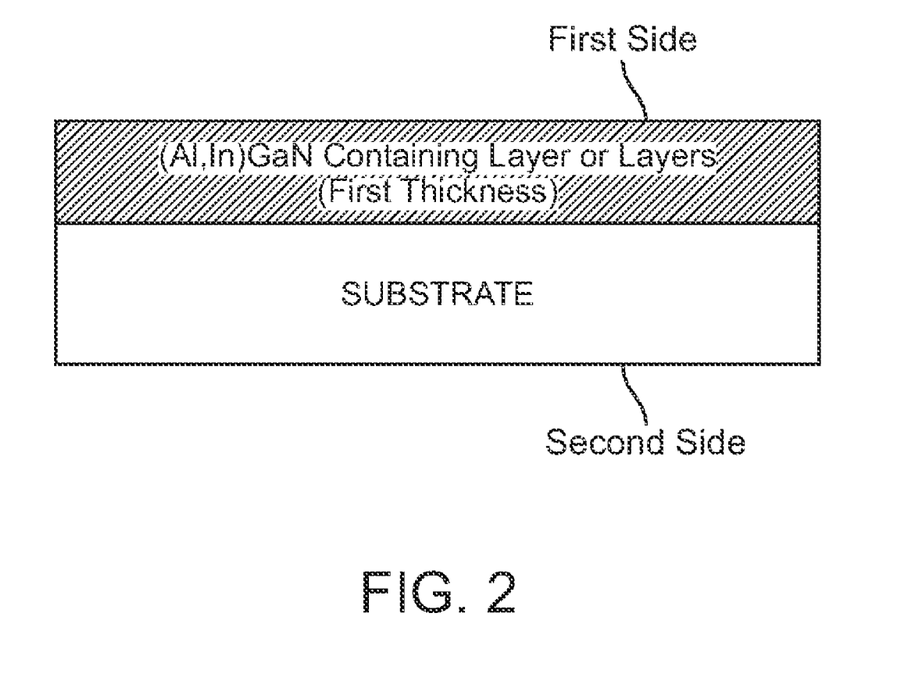
FIG. 2 is a simplified diagram illustrating a first thickness of (Al,In)GaN containing material on a first side of a crystalline substrate material formed by a growth method at elevated temperature, and illustrated at elevated temperature, according to an embodiment of the present invention.
Figure 3:
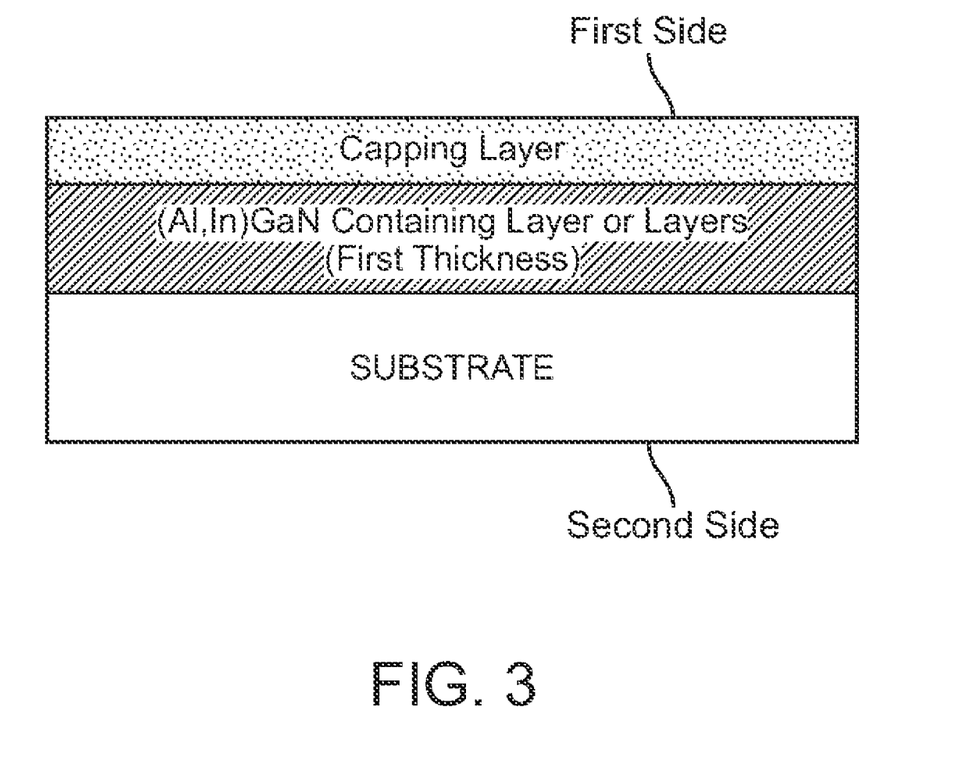
FIG. 3 is a simplified diagram illustrating a capping layer overlying a first thickness of (Al,In)GaN containing material on a first side of a crystalline substrate material, illustrated at elevated temperature, according to an embodiment of the present invention.
Figure 4:
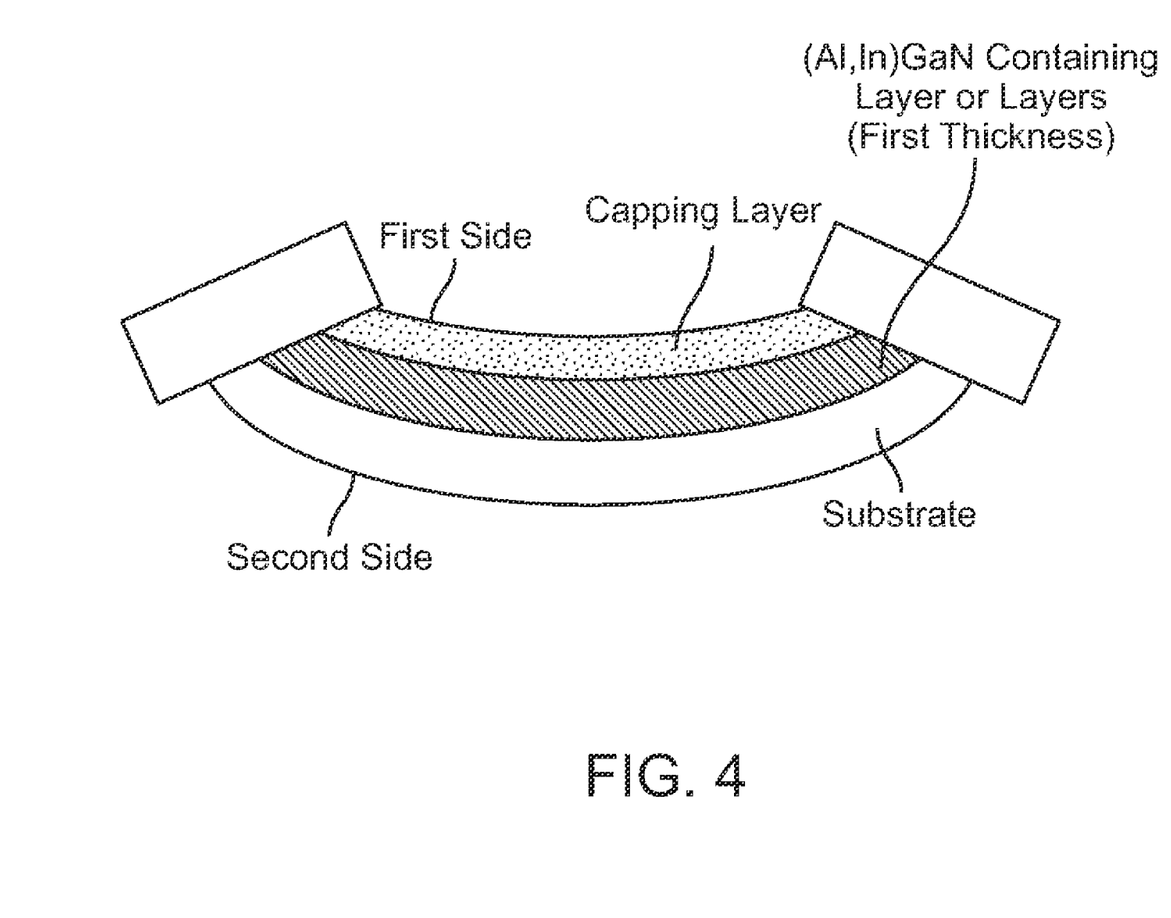
FIG. 4 is a simplified diagram illustrating a capping layer overlying a first thickness of (Al,In)GaN containing material on a first side of a crystalline substrate material, after being cooled from elevated temperature to room temperature, according to an embodiment of the present invention. The wafer exhibits curvature known as bow, bend or warp. Dimensions of wafer curvature are exaggerated for illustration.
Figure 5:
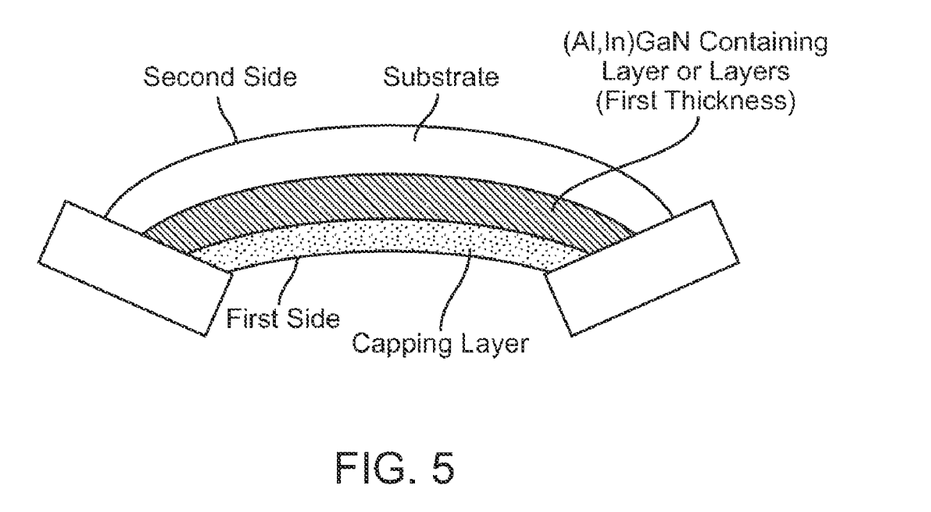
FIG. 5 is a simplified diagram illustrating reorienting a crystalline substrate material and overlying layers from a first side to a second side according to an embodiment of the present invention.
Figure 6:
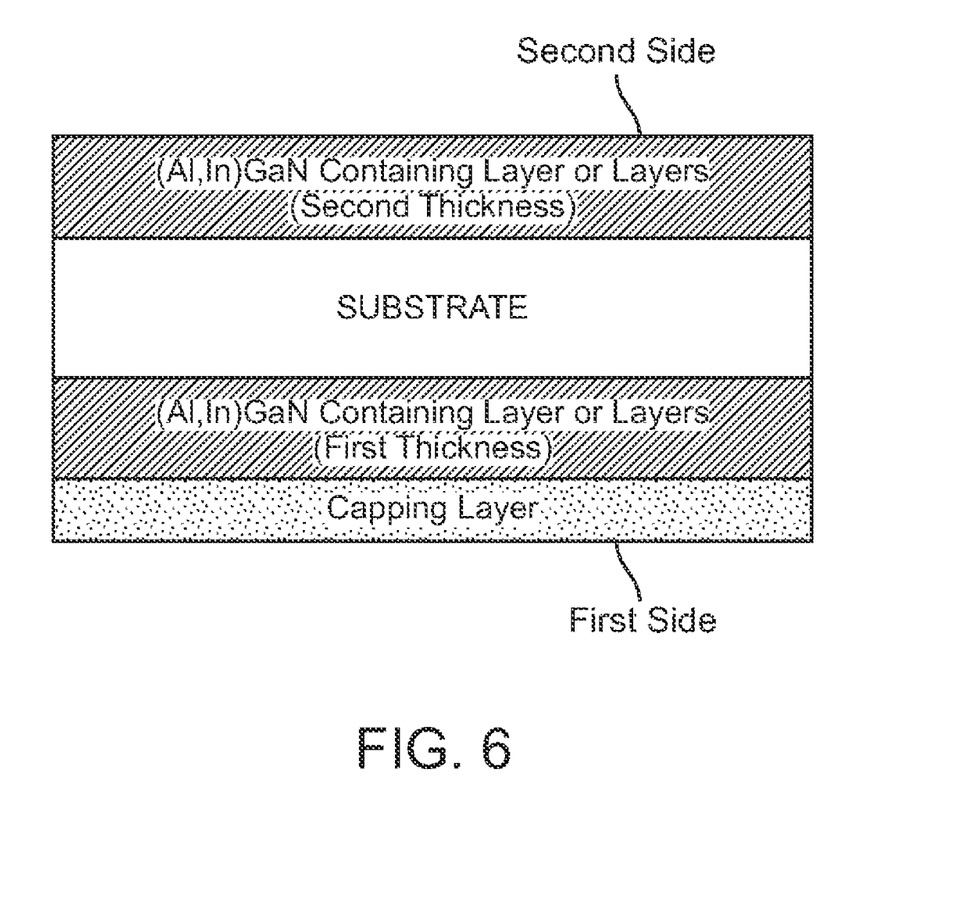
FIG. 6 is a simplified diagram illustrating a second thickness of (Al,In)GaN containing material deposited on a second side of a crystalline substrate material, formed by a growth method at elevated temperature and illustrated at elevated temperature, according to an embodiment of the present invention.
Figure 7:
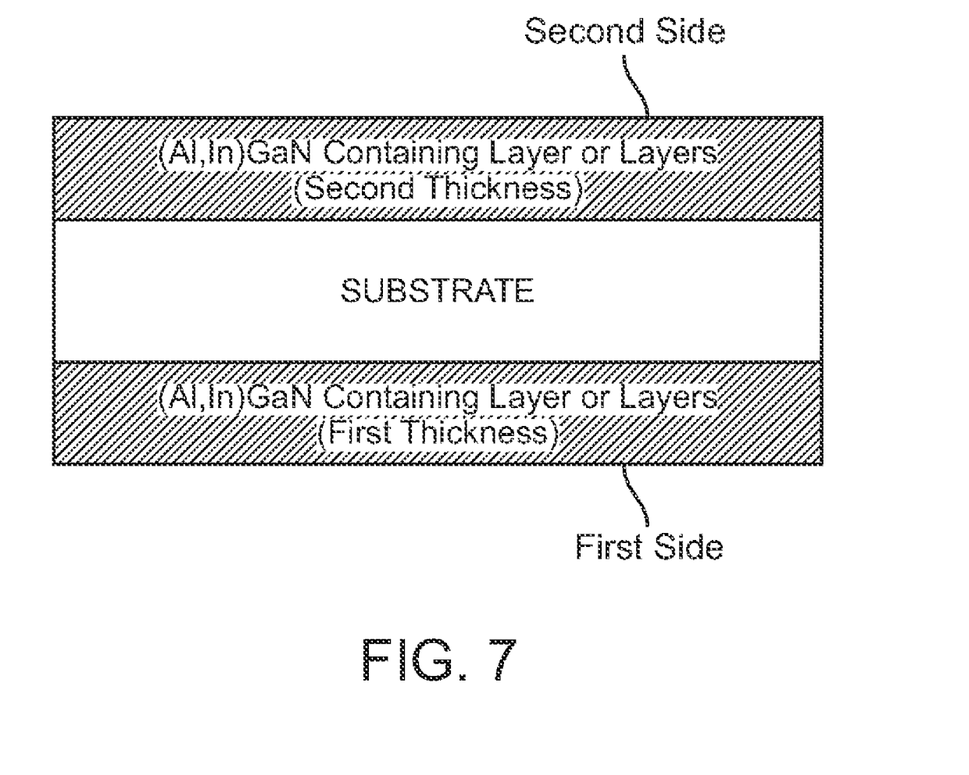
FIG. 7 is a simplified diagram of a double-sided seed crystal which is substantially free of bow, bend or warp, illustrated post-growth and after removal of the capping layer from the first side, according to an embodiment of the present invention.

In a specific embodiment as referred to in the Figures, the present invention includes a method for fabricating such a seed crystal utilizing double-sided growth:

1. Begin;
2. Provide a crystalline substrate material having a first and second side which are both suitable for epitaxial growth of (Al,B,In,Ga)N containing compounds (i.e. double-side polished), see FIG. 1;
3. Optionally, prepare (e.g., clean, degrease) the crystalline substrate material for a (Al,B,In,Ga)N growth technique;
4. Optionally, form dielectric and/or metal on the second side of the crystalline substrate material;
5. Transfer crystalline substrate material into a growth chamber, e.g., MOCVD;
6. Deposit (under desired thermal conditions) an (Al,B,In,Ga)N layer overlying the first side of the substrate using a nitride growth technique, see FIG. 2;
7. Optionally, deposit a mask or capping layer over the (Al,B,In,Ga)N layer on the first side of the substrate, see FIG. 3, (which may be in a separate chamber or use a separate and distinct process);
8. Obtain a resulting substrate material having a bow, bend, or warp therein, see FIG. 4;
9. Reorient substrate to expose second side including optional dielectric and/or metal layer, see FIG. 5;
10. Selectively remove dielectric and/or metal layer from the second side of the crystalline substrate material using an etching process if the crystalline substrate material has a dielectric and/or metal layer on the second side;
11. Optionally, prepare the substrate material with the overlying nitride layer for nitride growth on the second side of the crystalline substrate material using a (Al,B,In,Ga)N growth technique;
12. Optionally, deposit an additional layer, possibly a metal layer, on the capping layer overlying the first side of the substrate;
13. Deposit (under desired thermal conditions) a second thickness of an (Al,B,In,Ga)N layer (as in step 6), with a substantially similar lattice constant to the first (Al,B,In,Ga)N layer, overlying the second side of the crystalline substrate material, see FIG. 6;
14. Cool substrate and remove from growth chamber a substantially flattened wafer having deposited films on each side of the crystalline substrate material, see FIG. 7;
15. Selectively remove the additional layer, possibly a metal layer, from the first side of the wafer using an etching process if the wafer has an additional layer on the first side;
16. Remove capping layer from first side of crystalline substrate material if a capping layer is present on the first side;
17. Output wafer having double-sided deposition of films, see FIG. 7;
18. If needed, coat sidewalls to encapsulate exposed crystalline substrate material; and
19. Perform other steps, as desired.

The above sequence of steps provides a fabrication method for forming a seed crystal according to an embodiment of the present invention. In a specific embodiment, the present invention provides a method and device for forming a seed crystal containing a gallium containing species using a double-sided deposition process. Other alternatives can also be provided where steps are added, one or more steps are removed, one or more steps are modified or performed differently, or one or more steps are provided in a different sequence without departing from the scope of the claims herein. Of course, there can be other variations, modifications, and alternatives.

In a specific embodiment, during deposition on the first ("front") side of the substrate at the growth temperature, with or without employing defect reduction techniques, the wafer is flat and free of bowing. Upon cooling after growth, bowing can be present due to the difference in thermal expansion coefficients of the grown nitride containing layer(s) and the substrate. The second step is an identical deposition on the second ("back") side of the substrate. At the growth temperature, and during deposition of the second nitride containing layer, the wafer is again flat and free of bowing. Upon cooldown, which takes the substrate back to room temperature, with nominally identical material layers on both sides of the substrate, the strain gradients in opposite directions would be substantially balanced, thus eliminating or greatly reducing the bowing and retaining a substantially flat wafer. In order to realize growth on the second ("back") side of the wafer without causing the GaN on the front side to decompose under thermal conditions during growth, a mask or capping layer may be employed. The capping layer could consist of AlN, SiN, $Si_3N_4$, $SiO_2$, TaO, metals such as Ti, Ta, Mo, Ag, Au, W, or Pt, silicides or nitrides of these metals, among others, and could be deposited in-situ or ex-situ. The capping layer should be stable in the GaN growth environment and able to be subsequently removed with minimal interaction with the underlying material. This capping layer is deposited on the front side of the substrate overlying the first nitride deposition. This capping layer could be deposited by e-beam evaporation, sputtering, chemical vapor deposition, or other deposition techniques.

In a specific embodiment, the wafer is turned over and identical growth is performed on the back side of the wafer. The resulting wafer can be large-area due to the possibility of using common large-area substrates for epitaxy (for example circular sapphire substrates are available with 2-8" diameter and can be utilized for deposition of nitride containing materials by the aforementioned techniques). The substrates used could be circular, square, rectangular or other arbitrary shape.

In preferred embodiments, the wafer is circular as this shape could mitigate delamination effects (the separation of the grown nitride containing layer from the substrate) after growth. Delamination can occur due to higher thermal mismatch stresses in the deposited films at the edges of the wafer as compared to the center. A possible way to mitigate these stress effects is to maximize the area-to-perimeter ratio of the substrate. The area-to-perimeter ratio will be largest in a circular substrate geometry, and smaller in square, rectangular, or other arbitrary geometries, for example. If non-circular substrate geometries are used, the stress is higher at corners relative to the edges. In this case the corners of the substrate could be rounded by machining such as grinding to mitigate these effects. In all cases, the resulting wafer with double-sided growth of nitride containing films will be of sufficiently high crystalline quality due to growth techniques which are known in the art for nitride thin films. For c-plane-oriented GaN, for example, full-width at half-maximum (FWHM) values from high-resolution x-ray diffraction omega rocking curve scans across the (002) and (201) reflections could be <0.1 degrees and <0.3 degrees, respectively.

Nitride containing wurtzite materials are commonly known as "polar" materials due to lack of inversion symmetry in the crystal structure. Such materials exhibit both spontaneous and strain-induced, or piezoelectric polarization along the c-axis, or [0001] axis. The c-direction, or [0001] direction, is a common growth direction for these materials, and is commonly known as the polar axis or polar growth direction. The net polarization and consequent internal electric fields in such materials are well known to influence electrical and optical properties and device performance. The polarity of these materials is commonly characterized as "Gallium-face" or "Gallium-polar" if the [0001] direction is the primary growth direction. The polarity of these materials is commonly characterized as "Nitrogen-face" or "Nitrogen-polar" if the [000-1] direction is the primary growth direction. In a specific embodiment of the present invention, the nitride containing material has an orientation within 10 degrees of (0001) or (000-1).

One approach for eliminating the spontaneous and piezoelectric polarization effects in nitride devices is to grow the devices on "nonpolar" planes of the crystal. Primary growth directions oriented at approximately 90 degrees to (0001) or (000-1) are known as "nonpolar" orientations of the material, as the polar axis is normal to the primary growth direction. Two such families of nonpolar planes for wurtzite nitride containing materials are {10-10}, known collectively as m-planes, or {11-20}, known collectively as a-planes. In a specific embodiment of the present invention, the nitride containing material has an orientation within 10 degree of (10-10) or (11-20) and their associated families of planes.

Primary growth orientations which are oriented at angles between 0 and 90 degrees of [0001] or [000-1] are known as "semipolar" orientations of the material. There are a wide variety of such semipolar planes, which can be defined as having both two nonzero h, i, or k Miller indices and a nonzero l Miller index. Families of such semipolar planes include {10-11} and {11-2l}, for example, where l is a nonzero integer. Specific examples of commonly observed semipolar planes in GaN include {11-22}, {10-11}, and {10-13}. Other examples in the wurtzite crystal structure include, but are not limited to, {10-12}, {20-21}, {11-21} and {10-14}. Semipolar materials exhibit polarity, although the net polarization vector lies at an angle inclined relative to the plane's surface normal rather than in-plane or normal to the plane. Semipolar materials are characterized as "Ga-polar" or having "Ga-face polarity" if the [0001] direction is oriented toward the film surface normal. Semipolar materials are characterized as "N-polar" or having "N-face polarity" if the [000-1] direction is oriented toward the film surface normal. In a specific embodiment of the present invention the nitride containing material has an orientation within 5 degrees of (10-11), (10-1-1), (10-12), (10-1-2), (10-13), (10-1-3), (11-21), (11-2-1), (20-21), (20-2-1), (10-14), (10-1-4), (11-22) or (11-2-2), along with their associated families of planes.

According to a preferred embodiment of the present invention, it is desirable that the resulting material have the same crystallographic orientation, and therefore the same polarity, on both sides of the substrate. Preferred embodiments could utilize substrates such as double-side polished sapphire, (111) Si, or (111) $Mg_2AlO_4$ spinel which would result in the same crystallographic orientation of nitride containing material on both sides.

Gallium face or Nitrogen face polarity can be realized with either growth technique depending on both the substrate and growth conditions. It has been established that using MOCVD, the polarity of a GaN film on c-plane sapphire is determined by the growth initiation procedures (See for example, E. S. Hellman, MRS Internet J. Nitride Semicond. Res. 3, 11 (1998) and references therein, M. Stutzmann, O. Ambacher, M. Eickhoff, U. Karrer, A. Lima Pimenta, R. Neuberger, J. Schalwig, R. Dimitrov, P. J. Schuck, and R. D. Grober, Phys. Status Solidi B 228 (2001) 505, M. Sumiya and S. Fuke, MRS Internet J. Nitride Semicond. Res. 9 (2004) 1, S. Keller, B. P. Keller, Y. F. Wu, B. Heying, D. Kapolnek, J. S. Speck, U. K. Mishra, and S. P. DenBaars, Appl. Phys. Lett. 68, (1996) 1525). A standard two-step process with growth initiated with a thin GaN or AN layer at low temperatures, for example, has been shown to result in c-plane Ga-face films with high crystalline quality suitable for devices. (See for example, H. Amano, N. Sawaki, I. Akasaki, and Y. Toyoda, Appl. Phys. Lett. 48, 353 (1986), and S. Nakamura, Jpn. J. Appl. Phys., Part 2 30, L1705 (1991)). Nitridation of sapphire at high temperature prior to growth can result in formation of a thin AlN surface layer (See for example, N. Grandjean, J. Massies, and M. Lerous, Appl. Phys. Lett. 69, 2071 (1996)), and N-face films typically result. (See for example, P. Cantu, F. Wu, P. Waltereit, S. Keller, A. E. Romanov, U. K. Mishra, S. P. DenBaars, and J. S. Spec, Appl. Phys. Lett. 83, 674 (2003), and M. Stutzmann, O. Ambacher, M. Eickhoff, U. Karrer, A. Lima Pimenta, R. Neuberger, J. Schalwig, R. Dimitrov, P. J. Schuck, and R. D. Grober, Phys. Status Solidi B 228 (2001) 505). While N-face films by MOCVD have typically been of much poorer quality (high surface roughness and surfaces characterized by large hexagonal hillocks potentially due to inversion domains) (See for example, M. Sumiya, K. Yoshimura, T. Ito, K. Ohtsuka, S. Fuke, M. Mizuno, M. Yoshimoto, H. Koinuma, A. Ohtomo, and M. Kawasaki, J. Appl. Phys. 88, 1158 (2000), and J. L. Weyher, P. D. Brown, A. R. A. Zauner, S. Muller, C. B. Boothroyd, D. T. Foord, P. R. Hageman, C. J. Humphreys, P. K. Larsen, I. Grzegory, and S. Porowski, J. Cryst. Growth 204, 419 (1999)), it has been recently shown that high quality N-face GaN can be achieved using sapphire with higher degrees of miscut (See for example, S. Keller, N. Fichtenbaum, F. Wu, D. Brown, A. Rasales, S. P. DenBaars, J. S. Speck and U. K. Mishra, J. Appl. Phys. 102, 083546 (2007)). By MBE, for example, c-plane GaN with both polarities can also be achieved with varying growth conditions (See for example, S. K. Davidsson, M. F. Falth, X. Y. Liu, H. Zirath, and T. G. Andersson, J. Appl. Phys. 98, 016109 (2005) and K. Xu, N. Yano, A. W. Jia, A. Yoshikawa, and Kk. Takahashi, J. Cryst. Growth 237-239, Part 2, 1003 (2002)). Use of the dopant Mg has also been shown to result in polarity inversion under specific growth conditions by MBE (See for example, D. S. Green, E. Haus, F. Wu, L. Chen, U. K. Mishra and J. S. Speck, J. Vac. Sci. Tech. B 21, 1804 (2003)). Various semipolar orientations have also been experimentally realized. For example, (10-1-1) GaN on (100) $MgAl_2O_4$ spinel and (10-13) GaN on (110) $MgAl_2O_4$ spinel have been realized utilizing HVPE (See for example, T. J. Baker, B. A. Haskell, F. Wu, J. S. Speck, and S. Nakamura, "Characterization of planar semipolar gallium nitride films on spinel substrates", Japanese Journal of Applied Physics 44, L920 (2005)), and (10-1-3) GaN on (1010) sapphire and (11-22) GaN on (10-10) sapphire (See for example, T. J. Baker, B. A. Haskell, F. Wu, J. S. Speck, and S. Nakamura, "Characterization of planar semipolar gallium nitride films on sapphire substrates", Japanese Journal of Applied Physics 45, L154 (2006)). Use of any of these techniques and substrates, or a combination of them, can be used to give the desired orientation and polarity of nitride material in the present invention.

Alternatively in a specific embodiment, the orientation and polarity of the resulting nitride layers on each side of the substrate will be different. An example is a substrate such as SiC, where one side of the wafer is terminated primarily by Si atoms and the other side primarily by C atoms. The polarity of the resulting nitride layers on either side will be different. The Si-terminated surface can often result in Ga-polar GaN films and the C-terminated surface can often result in N-polar GaN films, for example. In a specific embodiment wafer fusion could be used, for example, to bond two SiC wafers at their C-terminated sides resulting in two Si-terminated sides exposed for growth. In another embodiment a similar wafer fusion procedure could be used to fuse Si-terminated sides of two SiC wafers resulting in C-terminated sides exposed for growth. This would allow for the same polarity nitride film to be achieved on both sides of the substrate during the double-sided growth method described herein. This wafer fusion procedure could also be applied to crystalline substrate materials other than SiC, or to a combination of substrate materials. In another embodiment, nitride containing material of the same polarity could be formed on two separate crystalline substrates by separate processes and the backsides could be subsequently fused.

In some embodiments of the present invention, one or more layers possessing different compositions may be utilized but that possess similar lattice constants. For example, GaN could be grown on one side of the substrate and lattice-matched AlInN could be grown on the opposite side of the substrate. The compositions of the first crystalline material on the first side of the substrate and the second crystalline material on the second side of the substrate are different but the lattice constant of the two materials are substantially the same being with about 0.05 Å of each other.

In some embodiments of the present invention one or more layers possessing different compositions may be utilized on one or both sides of the substrate. For example, GaN may be grown on one side of the substrate and InN and AlN may be grown on the opposite side of the substrate. Or, AlN and GaN may be grown on one side of the substrate and AlGaN may be grown on the opposite side of the substrate. Or, AlN and GaN may be grown on one side of the substrate and AlGaN and InN may be grown on the opposite side of the substrate. In another embodiment, one or more compositional gradients could be utilized. The composition of the (Al,B,In,Ga)N containing material on one or both sides of the substrate could be changed over some or all of the thickness of the material. For example, on one or both sides of the substrate, AN could be deposited and then an AlGaN material could be deposited where the Ga composition increases until the AlGaN layer becomes a GaN layer. The compositional gradient can occur over any thickness. One or more different compositional gradients could be utilized on either side of the substrate. The compositional gradient approach could also be used in conjunction with the multiple layer approach. In any of these methods or a combination thereof, specific compositions, layer structures, compositional gradients and/or thicknesses may be chosen for each side of the substrate to produce a resulting wafer composed of (Al,B,In,Ga)N containing material on both sides which is characterized by flat surfaces and is substantially free from bowing. This does not require that the thicknesses of (Al,B,In,Ga)N containing material on both sides of the wafer be substantially similar. Instead, the coefficients of thermal expansion of both (Al,B,In,Ga)N containing materials could be engineered to be similar to produce a substantially flat wafer, for example. Or, the strain gradients in the crystalline material on each side of the substrate could be matched to produce a flat wafer.

With some of these methods or a combination thereof, both sides of a resulting wafer will be composed of c-plane (Al,B,In,Ga)N containing material which is of either Ga-face (Ga-face will be the convention used in this document to describe the crystallographic facet containing Group-III atoms) or N-face polarity and is characterized by flat surfaces and is free of bowing. In some other of these methods or a combination thereof, both sides of the resulting wafer will be composed of nonpolar, semipolar, and/or c-plane (Al,B,In,Ga)N containing material which is characterized by flat surfaces and is substantially free of bowing. This material is thus, preferential for use as a seed crystal for ammonothermal growth. The GaN layers on both sides could be in the range of 0.5-500 microns thick depending on the growth technique. In a specific embodiment the deposition on the first and second sides of the wafer could consist of multiple layers of nitride containing material, in addition to a nucleation layer. In this embodiment the layer structures on the first and second sides of the wafer would be substantially the same, possessing substantially similar lattice constants for each corresponding layer.

In some embodiments the sidewalls of the substrate may be exposed after deposition on both sides of the substrate. In a specific embodiment, the substrate used for fabrication of the seed crystal described in the present invention herein should therefore be stable in ammonothermal growth environments which can be acidic or basic in nature and at high temperatures and pressures. If it is not stable, to avoid decomposition of the exposed substrate sidewall area during ammonothermal growth, the sidewalls could be coated with an encapsulant coating which is stable in the ammonothermal growth environment such as silver, gold, platinum, nickel, chromium, vanadium, among others including alloys of these materials. For good adhesion to the exposed substrate, a thin layer of a reactive metal such as titanium could be used prior to the metal encapsulant deposition. These metals could be deposited by techniques such as e-beam evaporation or sputtering, for example.

Following is an example illustrative of the present invention. It should be understood that this is presented as an example only, and should not be considered as limiting the scope of this invention which would include other embodiments not shown. Of course, there are other variations, modifications, and alternatives.

Example 1

In a specific embodiment, the substrate is c-plane-oriented sapphire, of any miscut orientation angle (i.e. within 10 degrees of (0001)). Both sides of the wafer are polished, for example with chemical-mechanical polishing, to provide atomically smooth surfaces suitable for epitaxy. In this embodiment molecular beam epitaxy (MBE) is the growth technique utilized to produce the nitride containing epitaxial layers. In this embodiment, one side of the wafer is first coated with a metal such as Ti or Pt, a refractory metal such as W, Mo, Ta, a silicide or nitride of one of these metals, among others, or any combination of these, in order to facilitate heat transfer to the substrate during MBE growth. The thickness of the metal containing layers could range in thickness from 0.5 to 2 microns but is not limited to this range. The metal containing layers can be deposited for example by e-beam evaporation, sputtering, chemical vapor deposition or a combination of these or other deposition techniques. The substrate is then typically de-greased in solvents such as, but not limited to, acetone, methanol and isopropanol, with or without use of an ultrasonic bath, and spin-dried or nitrogen blow-dried.

The sample is then mounted on a substrate holder with the metalized surface facing the direction of the heater during growth, and loaded into a chamber of the MBE system. The type of sample mounting and the configuration of the substrate holder will vary depending on the type and geometry of the MBE system being used. The substrate holder could include, but is not limited to, ceramic diffuser plates, backing wafers such as silicon, quartz, or sapphire, molybdenum, ceramic, or tungsten retaining rings, and molybdenum or tantalum faceplates, for example. In some cases the substrate could be indium-bonded to a carrier wafer. The substrate and holder should then be baked at high temperature (e.g. 100-800° C., but not limited to this range) prior to growth, in the growth chamber or preferably in a separate chamber, for ~1 hour or a sufficient amount of time to outgas water and other impurities from the surface. The outgassing can be monitored by the chamber pressure and potentially using a residual gas analyzer. In this embodiment, the growth chamber of the MBE system is equipped with a radio frequency plasma source, an ammonia gas injector, a combination of these, or another suitable source of active nitrogen for growth. It is possible but not necessary that the nitrogen source gas is further purified using a getter-filter prior to introduction to the growth chamber. Conventional Knudsen cells are available for group III sources. Pumping of any or all of the MBE system chambers can be achieved utilizing cryogenic pumps, turbo pumps, ion pumps, among others, or a combination of these.

After bake and transfer to the growth chamber if necessary, the substrate is heated to the growth temperature (typically 650-800 C), and appropriate constituent elements are introduced to the chamber to form a (Al,B,In,Ga)N layer or combination of (Al,B,In,Ga)N layers necessary to result in epitaxial growth on the substrate with a total thickness in the approximate range of 0.5-2 microns. Various growth conditions which result in high quality nitride containing films by molecular beam epitaxy are known in the art and demonstrated in literature (See for example, B. Heying, R. Averbeck, L. F. Chen, E. Haus, H. Riechert, and J. S. Speck, J. Appl. Phys. 88, 1855 (2000), G. Koblmuller, S. Fernandez-Garrido, E. Calleja, and J. S. Speck, Appl. Phys. Lett. 91, 161904 (2007), and G. Koblmuller, F. Wu, T. Mates, J. S. Speck, S. Fernandez-Garrido, and E. Calleja, Appl. Phys. Lett. 91, 221905 (2007)). An AN nucleation layer could or could not be used, and varying Group III/Group V flux ratios are utilized throughout growth. A two-step process comprising a low III/V ratio in the first GaN growth step and a high III/V ratio in the second GaN growth step has been shown to control dislocation density and result in high quality films on both sapphire and silicon carbide substrates, for example (See for example, M. J. Manfra, N. G. Weimann, J. W. P. Hsu, L. N. Pfeiffer, and K. W. West, Appl. Phys. Lett. 81, 1456 (2002), and P. Waltereit, C. Poblenz, S. Rajan, F. Wu, U. K. Mishra, J. S. Speck, Japanese Journal of Applied Physics 43, L1520 (2004)). A method for using ammonia as a nitrogen source to produce high quality MBE GaN layers has also been shown, for example, see A. L. Carrion, C. Poblenz, F. Wu, and J. S. Speck, J. Appl. Phys. 103, 093529 (2008). The miscut angle of the substrate is not known to influence the polarity of the film, although could influence crystal quality. It is possible that dopants could be intentionally incorporated in the epitaxial layers. A typical n-type dopant is Si, a typical p-type dopant is Mg, and typical compensating dopants are Be or C, for example. Under certain conditions Mg doping can result in polarity inversion (See for example, K. Xu, N. Yano, A. W. Jia, A. Yoshikawa, and K. Takahashi, J. Cryst. Growth 237-239, Part 2, 1003 (2002)). If Mg doping is utilized the appropriate conditions should be utilized to control polarity.

After MBE growth, the sample is removed from the chamber. The metal containing layer on backside of the substrate is then removed by wet etching in hydrofluoric acid, hydrochloric acid, nitric acid, sulfuric acid, among others, or a combination of these. The metal containing layer could also be removed by dry etching techniques such as RIE. The substrate is then rinsed in de-ionized water and dried with nitrogen. A second metal containing layer, identical to what was just removed, is then deposited on the front side of the substrate, overlying the grown nitride-containing material. This layer will be utilized for heat transfer during the next growth step. To prevent metal diffusion into the GaN at the growth temperature, a two-layer mask or cap could be deposited where the first layer could be AlN, SiN, $SiO_2$, TaO, among others, and the second layer could be the metal, for example.

The sample is now re-introduced into the MBE chamber and the same steps are performed as just described, but with the sample being mounted in the chamber with the opposite side facing for growth. An identical epitaxial layer is deposited. After growth, the mask or cap layer(s) are removed by dry etching or wet etching.

Following is an example illustrative of the present invention. It should be understood that this is presented as an example only, and should not be considered as limiting the scope of this invention which would include other embodiments not shown. Of course, there are other variations, modifications, and alternatives.

Example 2

In another embodiment the substrate is c-plane-oriented sapphire, of any miscut orientation angle (i.e. within 10 degrees of (0001)). Both sides of the wafer are polished, for example with chemical-mechanical polishing, to provide atomically smooth surfaces suitable for epitaxy. In this embodiment metal organic chemical vapor deposition (MOCVD) is the growth technique utilized to produce the nitride containing epitaxial layers. In this embodiment the substrate could be cleaned with organic solvents such as, but not limited to, acetone, methanol and isopropanol, with or without use of an ultrasonic bath. The sample should be spin-dried or blown dry with nitrogen and introduced into the MOCVD growth chamber. Preparation for growth could include pre-baking and annealing in $H_2$, for example >1000° C. Metalorganic sources such as trimethylgallium (TMGa), triethylgallium (TEGa), trimethylaluminum (TMAl), or trimethylindium ($TMIn_2$) with $H_2$ or $N_2$ carrier gas may be used with $NH_3$ as precursors to deliver constituent elements to the growth surface. A nitride containing layer with approximate thickness 0.5-10 microns is grown on the first side of the substrate using techniques which have been demonstrated for growth of high quality Ga-polar or N-polar films.[4-9,11-13] (See for example, T. M. Katona, M. D. Craven, P. T. Fini, J. S. Speck, and S. P. DenBaars, "Observation of crystallographic wing tilt in cantilever epitaxy of GaN on silicon carbide and silicon (111) substrates", Applied Physics Letters 79, 2907 (2001), A. E. Romanov and J. S. Speck, Appl. Phys. Lett. 83, 2569 (2003), P. Cantu, F. Wu, P. Waltereit, S. Keller, A. E. Romanov, U. K. Mishra, S. P. DenBaars, and J. S. Spec, Appl. Phys. Lett. 83, 674 (2003), E. S. Hellman, MRS Internet J. Nitride Semicond. Res. 3, 11 (1998) and references therein, M. Stutzmann, O. Ambacher, M. Eickhoff, U. Karrer, A. Lima Pimenta, R. Neuberger, J. Schalwig, R. Dimitrov, P. J. Schuck, and R. D. Grober, Phys. Status Solidi B 228 (2001) 505, M. Sumiya and S. Fuke, MRS Internet J. Nitride Semicond. Res. 9 (2004) 1, H. Amano, N. Sawaki, I. Akasaki, and Y. Toyoda, Appl. Phys. Lett. 48, 353 (1986), S. Nakamura, Jpn. J. Appl. Phys., Part 2 30, L1705 (1991), and N. Grandjean, J. Massies, and M. Lerous, Appl. Phys. Lett. 69, 2071 (1996)). An aluminum nitride (AlN) containing buffer layer or GaN buffer layer may or may not be used and growth could occur at either atmospheric pressure or lower pressures. A mask or capping layer such as SiN, $SiO_2$, TaO, among others, should be deposited after growth either in-situ or ex-situ. Such as mask or capping layer should be stable under GaN growth conditions and be able to be subsequently removed without damaging or reacting with the underlying nitride material. The sample is re-introduced into the MOCVD chamber and identical growth procedure is performed on the backside of the wafer. At the growth temperature and after cooldown, the double-sided wafer is free of bowing. After the double-sided wafer is removed from the growth chamber, the capping layer is etched off using dry or wet etching techniques.

Following is an example illustrative of the present invention. It should be understood that this is presented as an example only, and should not be considered as limiting the scope of this invention which would include other embodiments not shown. Of course, there are other variations, modifications, and alternatives.

Example 3

Preparation of a Seed Crystal

An approximately 4 μm thick GaN layer is epitaxially grown by metalorganic chemical vapor deposition (MOCVD) on one side of a 2 inch, c-plane, double-side polished sapphire wafer. The wafer is then flipped over and placed back in an MOCVD reactor. An approximately 4 μm thick GaN layer is epitaxially grown on the remaining exposed sapphire surface, producing a sapphire wafer with a 4 μm thick GaN layer on each side of the sapphire wafer.

Following is an example illustrative of the present invention. It should be understood that this is presented as an example only, and should not be considered as limiting the scope of this invention which would include other embodiments not shown. Of course, there are other variations, modifications, and alternatives.

Example 4

Preparation of a Seed Crystal

An approximately 4 μm thick GaN layer is epitaxially grown by MOCVD on one side of a 2 inch, c-plane, double-side polished sapphire wafer. The GaN layer is then annealed in a box furnace at 700° C. for 30 minutes to remove hydrogen from the GaN layer. A 200 Å thick layer of silicon nitride ($Si_3N_4$) is subsequently deposited on top of the GaN layer by plasma-enhanced chemical vapor deposition (PECVD) to protect the surface of the GaN layer during subsequent procedures. The wafer is then cleaned with acetone followed by isopropanol in an ultrasonic bath and immediately blown dry with nitrogen after removal of the wafer from the isopropanol. The wafer is then transferred to an MOCVD reactor where an approximately 4 μm thick GaN layer is epitaxially grown on the remaining exposed sapphire surface. After growth, the GaN layer is annealed in a box furnace at 700° C. for 30 minutes. The $Si_3N_4$ layer is then removed using a buffered oxide etch (BHF), producing a sapphire wafer with a 4 μm thick GaN layer on each side of the sapphire wafer.

Following is an example illustrative of the present invention. It should be understood that this is presented as an example only, and should not be considered as limiting the scope of this invention which would include other embodiments not shown. Of course, there are other variations, modifications, and alternatives.

Example 5

Preparation of a Seed Crystal

An approximately 4 μm thick GaN layer is epitaxially grown by MOCVD on one side of a 2 inch, c-plane, double-side polished sapphire wafer. The GaN layer is then annealed in a box furnace at 700° C. for 30 minutes to remove hydrogen from the GaN layer. A 1600 Å thick layer of silicon dioxide ($SiO_2$) is subsequently deposited on top of the GaN layer by sputter deposition to protect the surface of the GaN layer during subsequent procedures. The wafer is then cleaned with acetone followed by isopropanol in an ultrasonic bath and immediately blown dry with nitrogen after removal of the wafer from the isopropanol. The wafer is then transferred to an MOCVD reactor where an approximately 4 μm thick GaN layer is epitaxially grown on the remaining exposed sapphire surface. After growth, the $SiO_2$ layer is subsequently removed using a buffered oxide etch (BHF), producing a sapphire wafer with a 4 μm thick GaN layer on each side of the sapphire wafer.

Following is an example illustrative of the present invention. It should be understood that this is presented as an example only, and should not be considered as limiting the scope of this invention which would include other embodiments not shown. Of course, there are other variations, modifications, and alternatives.

Example 6

Preparation of a Seed Crystal

An approximately 4 μm thick GaN layer is epitaxially grown by MOCVD on one side of a 2 inch, c-plane, double-side polished sapphire wafer. The GaN layer is then annealed in a box furnace at 700° C. for 30 minutes to remove hydrogen from the GaN layer. A 1660 Å thick layer of silicon nitride ($Si_3N_4$) is subsequently deposited on top of the GaN layer by PECVD to protect the surface of the GaN layer during subsequent procedures. The wafer is then cleaned with acetone followed by isopropanol in an ultrasonic bath and immediately blown dry with nitrogen after removal of the wafer from the isopropanol. The wafer is then transferred to an MOCVD reactor where an approximately 4 μm thick GaN layer is epitaxially grown on the remaining exposed sapphire surface. The $Si_3N_4$ layer is then removed using a buffered oxide etch (BHF), producing a sapphire wafer with a 4 μm thick GaN layer on each side of the sapphire wafer.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of fabricating crystalline material containing at least a Group III element and N comprising:
    providing a crystalline substrate having a first surface and a second opposite surface;
    forming a first layer of crystalline material having a first thickness overlying the first surface of the substrate;
    providing the substrate having the overlying first layer of crystalline material; and
    forming a second layer of crystalline material also having substantially the same first thickness and having the same composition as the first layer of crystalline material overlying the second surface of the substrate such that the substrate together with the first layer of crystalline material and the second layer of crystalline material creates a structure substantially free from bow.

2. A method of fabricating crystalline material as in claim 1 wherein the structure substantially free from bow is then used as a seed for ammonothermal growth.

3. A method as in claim 1 wherein the first layer of crystalline material and the second layer of crystalline material are formed at the same time.

4. A method of fabricating crystalline material comprising:
    providing a crystalline substrate having a first surface and a second opposite surface;
    forming a first layer of crystalline material containing at least a Group III element and N having a first thickness overlying the first surface of the substrate; and
    forming a second layer of crystalline material also having substantially the same first thickness and having the same composition as the first layer of crystalline material overlying the second surface of the substrate such that the substrate together with the first layer of crystalline material and the second layer of crystalline material creates a structure substantially free from bow.

5. A method of fabricating crystalline material as in claim 1 wherein the structure substantially free from bow is then used as a seed for ammonothermal growth.

6. A method of fabricating crystalline material as in claim 5 wherein the step of forming the first layer of crystalline material containing at least a Group III element and N and the step of forming a second layer of crystalline material are performed at the same time.

7. The method of claim 1 wherein the first layer of crystalline material and the second layer of crystalline material have an epitaxial relationship with the crystalline substrate.

8. The method of claim 1 wherein the crystalline substrate is selected from sapphire, silicon carbide, silicon, $LiAlO_2$, $LiGaO_2$, $Mg_2AlO_4$ spinel, ZnO, and $ZrB_2$.

9. The method of claim 1 wherein the crystalline material comprises at least one of a gallium species and a nitrogen species, an aluminum species and a nitrogen species, or an indium species and a nitrogen species.

10. The method of claim 1 wherein the first layer and the second layer comprise material having substantially similar lattice constants within about 0.05 Å of each other.

11. The method of claim 1 wherein the crystalline material comprises a wurtzite crystal structure.

12. The method of claim 11 wherein crystalline orientation of the first layer and the second layer are within 10 degrees of (0001) or (000-1) crystallographic orientations.

13. The method of claim 11 wherein the crystalline orientation of the first layer and the second layer are semipolar or nonpolar, wherein nonpolar orientations comprise orientations within 10 degrees of {10-10} or {11-20} and wherein semipolar orientations comprise orientations within 5 degrees of (10-11), (10-1-1), (10-12), (10-1-2), (10-13), (10-1-3), (11-21), (11-2-1), (20-21), (20-2-1), (10-14), (10-1-4), (11-22) or (11-2-2), along with their associated families of planes.

14. The method of claim 1 wherein the first layer and the second layer are within 5 microns of each other in thickness.

15. The method of claim 1 wherein the first layer and the second layer are each between 0.5 microns to 1000 microns in thickness.

16. The method of claim 1 wherein the first layer is formed by a process selected from MOCVD, HVPE, or MBE, and the second layer is formed by a process selected from MOCVD, HVPE, or MBE.

17. The method of claim 1 further comprising at least one mask or overlying the first layer, wherein the at least one mask is deposited on the first layer prior to forming the second layer.

18. The method of claim 17 wherein the mask comprises at least one of Al, Si, $SiO_2$, TaO, Ti, Ta, Mo, Pt, Ag, Au, W, or silicides or nitrides of these materials.

19. The method of claim 1 wherein the crystalline substrate, the first layer of crystalline material, and the second layer of crystalline material form a composite structure that is substantially free from bow, the bow being less than about 500 microns for a crystalline substrate having a diameter of eight inches and greater, the bow being less than about 100 microns for a crystalline substrate having a diameter of two inches to about four inches, and the bow being less than about 300 microns for a crystalline substrate material having a diameter of four inches to eight inches.

20. An optoelectronic or electronic device grown on the crystalline material produced by the method of claim 1.

* * * * *